United States Patent
Derluyn et al.

(10) Patent No.: US 8,309,987 B2
(45) Date of Patent: Nov. 13, 2012

(54) ENHANCEMENT MODE SEMICONDUCTOR DEVICE

(75) Inventors: Joff Derluyn, Brussels (BE); Farid Medjdoub, Quévrechain (FR); Marianne Germain, Liége 1 (FR)

(73) Assignee: IMEC, Leuven (BE)

( * ) Notice: Subject to any disclaimer, the term of this patent is extended or adjusted under 35 U.S.C. 154(b) by 148 days.

(21) Appl. No.: 12/502,960

(22) Filed: Jul. 14, 2009

(65) Prior Publication Data

US 2010/0012977 A1 Jan. 21, 2010

Related U.S. Application Data

(60) Provisional application No. 61/080,983, filed on Jul. 15, 2008.

(30) Foreign Application Priority Data

Nov. 17, 2008 (EP) ..................................... 08169271

(51) Int. Cl.
*H01L 29/66* (2006.01)
(52) U.S. Cl. ....................................... 257/192; 257/194
(58) Field of Classification Search .................. 257/192, 257/194
See application file for complete search history.

(56) References Cited

U.S. PATENT DOCUMENTS

| | | | |
|---|---|---|---|
| 5,929,467 A | 7/1999 | Kawai et al. | |
| 6,989,556 B2 | 1/2006 | Braddock | |
| 2004/0155260 A1* | 8/2004 | Kuzmik | 257/192 |
| 2007/0123003 A1 | 5/2007 | Brask et al. | |
| 2008/0006845 A1* | 1/2008 | Derluyn et al. | 257/192 |
| 2010/0102359 A1* | 4/2010 | Khan et al. | 257/194 |

FOREIGN PATENT DOCUMENTS

| | | |
|---|---|---|
| EP | 1 865 561 A1 | 12/2007 |
| EP | 1 983 563 A1 | 10/2008 |
| WO | WO 2007/041595 | 4/2007 |

OTHER PUBLICATIONS

Lee, et al. "Improvement of Impact Ionization Effect and Subthreshold Current in InAlAs/InGaAs Metal-Oxide-Semiconductors Metamorphic HEMT With a Liquid-Phase Oxidized InAlAs as Gate Insulator", IEEE Transaction on Electron Devices, vol. 54, No. 3, Mar. 2007 pp. 418-424.
Pearton, et al "GaN: Processes, defects and devices" J. Appl. Phys. 86 (1), 1999.
Sun, et al. "Enhancement-Mode Buried-Channel $In_{0.7}Ga_{0.3}As/In_{0.52}Al_{0.48}As$ MOSFETs With High-$K$ Gate Dielectrics" IEEE Electron Device Letters, vol. 28, No. 6, Jun. 2007, pp. 473-475.
European Search Report dated Mar. 5, 2009 for EP Application No. 08169271.7.

* cited by examiner

*Primary Examiner* — Phat X Cao
(74) *Attorney, Agent, or Firm* — Knobbe Martens Olson & Bear LLP

(57) ABSTRACT

A semiconductor device is disclosed. In one aspect, the device has a first and second active layer on a substrate, the second active layer having a higher bandgap than the first active layer, being substantially Ga-free and including at least Al. The device has a gate insulating layer on a part of the second active layer formed by thermal oxidation of a part of the second active layer. The device has a gate electrode on at least a part of the gate insulating layer and a source electrode and drain electrode on the second active layer. The device has, when in operation and when the gate and source electrode are at the same voltage, a two-dimensional electron gas layer between the first and second active layer only outside the location of the gate electrode and not at the location of the gate electrode.

13 Claims, 11 Drawing Sheets

ENHANCEMENT MODE SEMICONDUCTOR DEVICE

CROSS REFERENCE TO RELATED APPLICATIONS

This application claims priority under 35 U.S.C. §119(e) to U.S. provisional patent application 61/080,983 filed on Jul. 15, 2008, which application is hereby incorporated by reference in its entirety.

BACKGROUND OF THE INVENTION

1. Technical Field of the Invention

The present invention relates to semiconductor devices. More particularly, the present invention relates to semiconductor devices comprising a 2-DEG layer only at locations different from locations where a gate electrode is located, e.g. an enhancement mode device, i.e. a normally-off device, in which no current can flow between source and drain contact unless a positive voltage is applied to the gate electrode, and to a method for forming such semiconductor devices.

2. Description of the Related Technology

Group III-nitride devices, such as e.g. high electron mobility transistors (HEMT), comprise a two-dimensional electron gas (2 DEG) between two active layers, e.g. between a GaN layer and an AlGaN layer. This 2DEG layer is a result of piezoelectric and spontaneous polarization leading to charge separation within the materials. In known devices of this type, the 2DEG is present at zero gate bias due to the characteristics of the materials. GaN field effect transistor devices (FET) with contacts formed on top of an AlGaN layer are normally-on devices. The formation of contacts on the AlGaN layer does not change the charge polarization in the heterostructure such that, if there was a 2DEG present before processing, it would remain there after formation of contacts on top of the AlGaN layer. A certain negative voltage, called threshold voltage, on the gate is required to deplete the 2DEG through capacitive coupling. By applying a negative voltage to the gate, the electron channel can be pinched off. This negative voltage is typically below a negative threshold voltage ($V_{th}$), typically between −4 V and −8 V. These transistors work in depletion-mode (D-mode) which means that the channel has to be depleted to switch off the transistor.

For certain applications, such as e.g. power switching or integrated logic, a negative-polarity gate voltage supply is not wanted; the gate control of power devices in e.g. power supplies should be made similar to that used for Si devices. Field-effect transistors (FET) with a threshold voltage $V_{th}=0$ V are normally-off devices. At zero gate voltage, no channel is present to conduct current. These transistors work in enhancement-mode (E-mode). E-mode transistors are attractive for normally-off power switches, for digital electronics applications, and for high efficiency RF applications.

To make a normally-off device, i.e. a device where no current can flow between source and drain contact when the gate is floating or grounded, the channel selectively under that gate contact can be interrupted while at the same time preserving an as high as possible 2DEG density in the other regions. A positive threshold voltage will then induce 2DEG under the gate contact, allowing current to flow between source and drain. Several methods have been reported to achieve such an E-mode transistor. For example, a reduction of the barrier thickness or a gate recess technology has been performed in order to decrease the gate to channel distance resulting in positive threshold voltages. Also, a self-aligned fluorine implantation prior to the gate deposition has been employed in order to locally deplete the bi-dimensional electron gas. More recently, E-Mode devices have been obtained by using hole injection from a p-type AlGaN material under the gate to the AlGaN/GaN heterojunction. However, all these methods result in poor device performances as compared to depletion mode devices, especially in terms of maximum current density.

In the E-Mode configuration, a metal insulator semiconductor high electron mobility transistor (MISHEMT) is preferred because of the possibility to overdrive the gate in the forward direction which enables to benefit from the full sheet carrier density. In the case of MISHEMTs, gate dielectrics have been used comprising $SiO_2$, $Si_3N_4$ and other oxides with high dielectric constant such as $Al_2O_3$, $HfO_2$ or $Sc_2O_3$ (high k dielectrics). However, in all cases, the interface between the semiconductor and the deposited oxide is difficult to control which prevent to benefit from the full potentiality of the MISHEMT configuration.

U.S. Pat. No. 5,929,467 describes a GaN-type field effect transistor with a gate insulating film. A channel layer and a gate insulating film are sequentially laminated on a substrate with a buffer layer in between. The channel layer is formed from n-type GaN. The insulating film is formed of AlN or AlGaN and increases the Schottky barrier height thereby obtaining a large input amplitude.

U.S. Pat. No. 6,989,556 describes a self-aligned enhancement mode metal-oxide compound semiconductor field-effect transistor including a gate insulating structure comprising a first oxide layer that includes a mixture of indium and gallium oxide compounds positioned directly on top of the compound semiconductor structure and a second insulating layer comprising either gallium, oxygen and rare earth elements or gallium, sulphur and rare earth elements positioned on top of the first layer.

WO 2007/041595 recites a III-nitride semiconductor device which includes a gate structure composed of, for example SiO2 or Si3N4 and a gate electrode.

SUMMARY OF CERTAIN INVENTIVE ASPECTS

Certain inventive aspects relate to a semiconductor device, e.g. an enhancement mode transistor, and a method for forming such semiconductor device, e.g. an enhancement mode transistor.

In a first aspect, the present invention provides a semiconductor device, e.g. an enhancement mode transistor. The semiconductor device comprises a first active layer on a substrate. The device further comprises a second active layer on the first active layer, the second active layer having a higher bandgap compared to the first active layer, being substantially Ga-free. The device further comprises a gate insulating layer on at least a part of the second active layer, the gate insulating layer being formed by thermal oxidation of at least a part of the second active layer, thereby consuming the top part of the second active layer and reducing the thickness of the second active layer so that the 2DEG is locally depleted. The device further comprises a gate electrode on at least a part of the gate insulating layer and a source electrode and drain electrode on the second active layer. When in operation and when the gate electrode and source electrode are at a same voltage, the semiconductor device further comprises a two-dimensional electron gas (2-DEG) layer between the first active layer and the second active layer only outside the location of the gate electrode and not at the location of the gate electrode.

Hence, according to embodiments of the invention, the semiconductor device comprises, when in operation and when the gate electrode and source electrode are at a same voltage, a 2-DEG layer only between the first active layer and the second active layer at locations of the device where no gate electrode is located and does not comprise a 2-DEG layer underneath the gate electrode. The freedom from gallium has the advantage that thermal oxidation of a gallium containing layer such as GaN or AlGaN results in $Ga_2O_3$ which is very unstable and has detrimental effects on the operation of the device.

According to embodiments of the present invention, the second active layer can be a Group III nitride. According to an embodiment of the present invention, the second active layer may further comprise Al. According to embodiments of the present invention, the second active layer can be Indium-free.

According to embodiments of the invention, the second active layer may comprise $In_xAl_{1-x}N$, x being between 0 and 0.5 or between 0 and 0.3. According to specific embodiment, x may be between 0.15 and 0.20, for example, x may be 0.17.

According to a further embodiment, the second active layer can have a graded indium (In) composition or a graded Group III, e.g. graded aluminium (Al) composition.

According to embodiments of the present invention, the second active layer may have a thickness of between 1 nm and 100 nm, between 1 nm and 50 nm, between 1 nm and 20 nm or between 5 nm and 15 nm and may, for example, be 10 nm.

According to embodiments of the present invention, the gate insulating layer may have a thickness of between 1 nm and 100 nm, between 1 nm and 50 nm, between 1 nm and 20 nm or between 5 nm and 15 nm and may, for example, be 10 nm.

The gate insulting layer may, for example, be formed by rapid thermal oxidation of the second active layer in an oxygen comprising ambient. Oxidation is carried out by heating the wafer in the rapid thermal processing chamber to a temperature of between 500° C. and 1000° C.; preferably between 700° C. and 900° C. The wafer is maintained at the predetermined temperature for a period corresponding to the required oxide thickness.

The gate insulating layer may comprise at least Al and oxygen. In a particular embodiment, the gate insulating layer may comprise Al, In and oxygen, wherein the amount of In is, e.g. below 5%.

According to embodiments of the invention, the first active layer may comprise a group III-nitride material. For example, the first active layer may comprise GaN.

According to embodiments of the invention, the second active layer may comprise a recess which does not protrude into the layers underlying the second active layer. According to these embodiments, the gate insulating layer may be formed in the recess in the second active layer.

According to embodiments of the present invention, the semiconductor device is preferably an enhancement mode (E-mode) transistor.

According to embodiments of the invention, the semiconductor device may furthermore comprise a passivation layer on top of the second active layer, the passivation layer being present on at least a part of the second active layer where no gate insulating layer is present.

The passivation layer may comprise a recess at the part of the second active layer where the gate insulating layer and the gate electrode are formed.

A device as recited in any of the previous paragraphs wherein the passivation layer comprises a high energy bandgap dielectric layer or multiple layers of different materials (like $Si_3N_4$, $SiO_2$ and other oxides with high dielectric constant like $Al_2O_3$, $HfO_2$ or $Sc_2O_3$) acting as diffusion barrier to corrosion.

The semiconductor device may furthermore comprise a spacer layer between the first active layer and the second active layer.

According to embodiments of the invention, the spacer layer may comprise AlN.

In accordance with embodiments of the present invention a third active layer can be located between the substrate and first active layer, the third active layer having a bandgap higher than the bandgap of the first active layer and the third active layer having a pyro-electric polarization higher than the pyro-electric polarization of the first active layer.

In a second aspect, the present invention provides a method for forming a semiconductor device, e.g. an enhancement mode transistor. The method comprises providing a first active layer on a substrate. The method further comprises providing a second active layer on the first active layer, the second active layer having a higher band gap compared to the first active layer, being substantially Ga-free. The method further comprises oxidizing at least a part of the second active layer by thermal oxidation thereby forming a gate insulating layer, thereby consuming the top part of the second active layer and reducing the thickness of the second active layer so that the 2DEG is locally depleted. The device further comprises providing a gate electrode on the gate insulating layer and providing a source electrode and drain electrode on the second region of the second active layer.

The providing of the first active layer and the second active layer is performed such that, when in operation and when the gate electrode and source electrode are at a same voltage, the semiconductor device furthermore comprises a two-dimensional electron gas layer between the first active layer and the second active layer only outside the location of the gate electrode and not at the location of the gate electrode.

Hence, according to embodiments of the invention, providing the first active layer and the second active layer may be performed such that, when in operation and when the gate electrode and source electrode are at a same voltage, a 2-DEG layer is present between the first active layer and the second active layer only at locations of the device where no gate electrode is located and not underneath the gate electrode.

According to embodiments of the present invention, the second active layer can be a Group III nitride.

According to embodiments of the invention, the second active layer may comprise Al. According to embodiments of the present invention, the second active layer can be Indium-free.

According to embodiments of the invention, the second active layer may comprise $In_xAl_{1-x}N$, x being between 0 and 0.5 or between 0 and 0.3. For example, x may between 0.15 and 0.20, and may e.g. be 0.17.

According to a further embodiment, the second active layer may have a graded indium (In) or a graded Group III, e.g. graded aluminium (Al) composition.

Providing the first active layer and/or providing the second active layer may be performed by depositing the first active layer and/or the second active layer by, for example, CVD (chemical vapour deposition), MOCVD (metalorganic chemical vapour deposition) or RF MBE (radio frequency molecular beam epitaxy).

According to embodiments of the present invention, providing the first active layer may be performed such that it has a thickness of between 1 nm and 100 nm, between 1 nm and 50 nm, between 1 nm and 20 nm or between 5 nm and 15 nm. For example, providing the first active layer may be performed such that it has a thickness of 10 nm.

According to embodiments of the present invention, providing the second active layer may be performed such that it has a thickness of between 1 nm and 100 nm, between 1 nm and 50 nm, between 1 nm and 20 nm or between 5 nm and 15 nm. For example, providing the second active layer may be performed such that it has a thickness of 10 nm.

The gate insulating layer may, for example, be formed by rapid thermal oxidation of the second active layer in an oxygen ambient.

According to embodiments of the invention, the gate insulating layer may comprise at least Al and oxygen.

According to embodiments of the invention, the first active layer may comprise a group III-nitride material. For example, the first active layer may comprise GaN.

According to embodiments of the invention, the semiconductor device is preferably an enhancement mode (E-mode) transistor.

According to embodiments of the invention, the method may furthermore comprise depositing a passivation layer on top of the second active layer, the passivation layer being present on at least a part of the second active layer where no gate insulating layer present.

The passivation layer may comprise a recess at a part of the second active layer where the gate insulating layer and the gate electrode are formed.

The passivation layer may comprise a high energy bandgap dielectric layer or multiple layers of different materials (like $Si_3N_4$, $SiO_2$ and other oxides with high dielectric constant like $Al_2O_3$, $HfO_2$ or $Sc_2O_3$) acting as a diffusion barrier for corrosion.

According to embodiments of the invention, the method may furthermore comprise depositing a spacer layer between the first active layer and the second active layer. According to embodiments of the invention, the spacer layer may comprise AlN.

According to a further embodiment a third active layer is grown between the substrate and first active layer, the third active layer having a bandgap higher than the bandgap of the first active layer and the third active layer having a pyro-electric polarization higher than the pyro-electric polarization of the first active layer.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
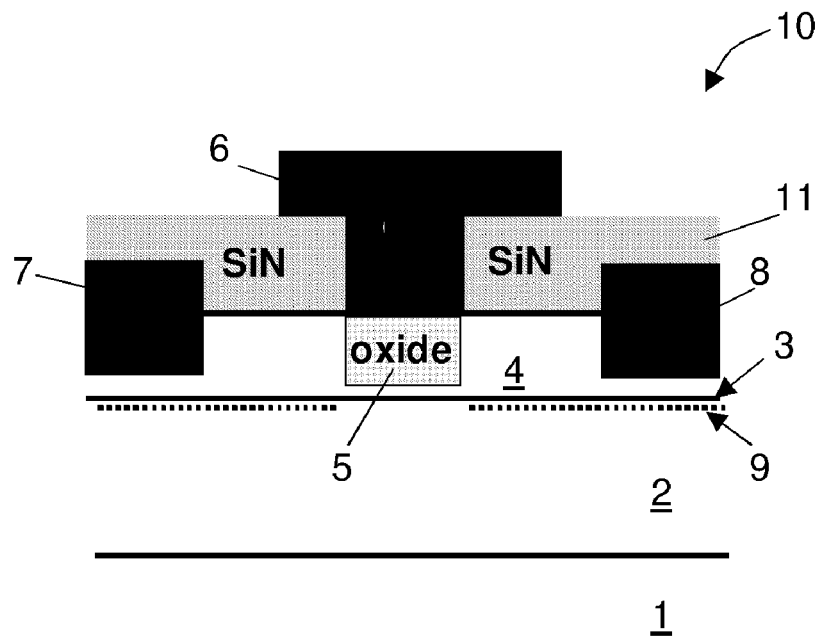
FIG. 1 to FIG. 8 are illustrative examples of semiconductor devices according to embodiments of the present invention.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and that the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the context of the present invention and except otherwise specified, the term "on" when referring to the relative positions of two layers can mean "directly or immediately on" or can mean above with one or more intervening layers. Hence, when it is the that a second layer is provided on a first layer, the second layer can be provided on the first layer such that is in direct contact with the first layer, i.e. there is no intermediate layer in between the first and second layer, or the second layer can be provided on the first layer such that it is in indirect contact with the first layer, i.e. that there is an intermediate layer in between the first and second layer.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes. It will be clear for a person skilled in the art that the present invention is also applicable to similar devices that can be configured in any transistor technology, including for example, but not limited thereto, CMOS, BICMOS, Bipolar and SiGe BICMOS technology.

Certain inventive aspects of the invention relate to an enhancement mode (i.e. normally-off) metal oxide semiconductor field effect transistor device (MOSFET) with a high quality junction between the oxide and the semiconductor layers, and further to an enhancement mode (i.e. normally-off) field effect transistor device with an oxide layer as gate insulating layer.

Certain embodiments relate to a semiconductor device and a method for manufacturing such a semiconductor device.

In a first aspect, the present invention provides a semiconductor device. The semiconductor device comprises:
  a first active layer on a substrate,
  a second active layer on the first active layer, the second active layer having a higher bandgap compared to the first active layer and comprising substantially no Ga,
  a gate insulating layer on at least a part of the second active layer, the gate insulating layer being formed by thermal oxidation of at least a part of the second active layer, thereby consuming the top part of the second active layer and reducing the thickness of the second active layer so that the 2DEG is locally depleted,
  a gate electrode on at least a part of the gate insulating layer,
  a source electrode and a drain electrode on the second active layer.
wherein, when in operation and when the gate electrode and source electrode are at a same voltage, the semiconductor device furthermore comprises a two-dimensional electron gas (2-DEG) layer between the first active layer and the second active layer only outside the location of the gate electrode and not at the location of the gate electrode.

Hence, according to embodiments of the invention, the semiconductor device comprises, when in operation and when the gate electrode and source electrode are at a same voltage, a 2-DEG layer only between the first active layer and the second active layer at locations of the device where no gate electrode is located and does not comprise a 2-DEG layer underneath the gate electrode.

As a result hereof, the device has a significantly enhanced thermal stability, and a strongly reduced gate leakage current. Experiments have shown an increase of the thermal stability from 700 up to 900 degrees Celsius. This is practically very relevant, as it enables a much larger temperature domain for any subsequent processing steps. The reduction of the gate leakage current is exponential and is found in experiments to occur at a gate-source voltage of zero volt. Thus, without a gate bias voltage, there is no mobility in the 2-DEG layer below the gate, hence it is locally depleted.

The inventors have observed, that with the oxidation, the gate insulating layer results directly from the second active layer and that thus no interfacial layer is formed. The absence of interfacial states present in such interfacial layer is believed to lead to the higher reliability.

The substrate may comprise any material that can be used as a substrate in III-V semiconductor processing, such as e.g. silicon, sapphire ($Al_2O_3$), SiC, GaN, AlN, GaAs, Ge or diamond. Also substrates comprising one or more of these materials can be used, such as silicon on insulator or GaN on diamond.

The semiconductor device comprises a first active layer e.g. a GaN layer which is provided, e.g. deposited on the substrate, and a second active layer, e.g. a Group III nitride layer or an Indium or Gallium free layer, or a layer including aluminum or an InAlN layer which is provided on the first active layer. In general, the second active layer has a higher bandgap when compared to the first active layer. Alternative materials for the substrate and first and second active layers will be described further in this description, as well as possible techniques for depositing the layers. Depending on the thickness, the composition and the loading effects on the surface of the second active layer, a two-dimensional electron gas (2 DEG) may appear at the interface between the two active layers.

The first and/or second active layers may, according to embodiments of the invention, comprise group III-nitride semiconductor material. They may preferably be, but not exclusively or limited to, monocrystalline layers.

The first active layer can comprise a group III-nitride compound. In an embodiment, the first active layer can comprise or consist of GaN, AlGaN, InGaN, InAlGaN, BN or combinations thereof.

According to embodiments of the invention, the second active layer comprises at least Al. The second active layer may, for example, comprise or consist of AlInN. However the second active layer can also be Indium free or can be rendered Indium free. The second active layer is preferably a Ga-free layer, or in other words, the second active layer does not comprise Ga. Optionally the second active layer does not comprise Ga and In.

The bandgap of the second active layer needs to be higher than the bandgap of the first active layer. According to embodiments of the invention, the first active layer may, for example, be a GaN layer and the second active layer may, for example, an InAlN layer. InAlN with 17% In-content as a barrier material the heterosystem becomes lattice matched, but nevertheless a high channel current density of approximately 3 times that obtained with AlGaN barriers can be achieved, only generated by the difference in spontaneous polarization. This results in maximum current densities beyond 2 A/mm without piezoelectric polarization which makes this unstrained heterostructure very attractive for high performance/high reliability HEMT devices. Moreover, with this heterojunction an exceptional thermal stability above 1000° C. of the InAlN semiconductor and InAlN/GaN heterostructure has been observed, even with extremely thin barrier layer down to 3 nm.

The second active layer may gave a thickness of between 1 nm and 100 nm, between 1 nm and 50 nm, between 1 nm and 20 nm or between 5 nm and 15 nm. The thickness of the second active layer under the gate insulating layer may be between 1 nm and 10 nm or between 1 nm and 5 nm and may, for example, be 2 nm. For InAlN/GaN, the thickness of the second active layer is between 1 and 3 nm.

According to embodiments of the present invention, the thickness, the composition and the loading effects on the surface of the second active layer are chosen such that substantially no 2DEG is created at the interface between the two active layers at the region below the gate electrode, also referred to as gate contact. One way of obtaining this result is e.g. to choose the second active layer with a thickness being thinner than a predefined minimum thickness in the region below the gate contact.

The gate insulating layer is formed by oxidizing at least a part of the second active layer by rapid thermal oxidation in an oxygen environment. The part of the second active layer that undergoes oxidation may also be referred to as the first part of the second active region. This is the part where the gate contact is formed. According to embodiments of the invention, the gate insulating layer may comprise at least oxygen and Al, such as e.g. $Al_2O_3$. Since the second active layer does not comprise Ga, the formation of $Ga_2O_3$ is avoided. $Ga_2O_3$ is detrimental for the current collapse in group III-nitride devices because of its low thermal and chemical stability (Pearton et al "GaN: Processes, defects and devices" J. Appl. Phys. 86 (1), 1999).

By oxidizing at least a part of the second active layer in an oxygen ambient, a predetermined part of the second active layer is converted into the gate insulating layer such that the remaining thickness (this is the non-oxidized part) of the second active layer is below the tunneling thickness, thus lower than the critical thickness needed to obtain a 2DEG. The thickness of the gate insulating layer is selected such that the 2DEG is fully depleted under the gate region (see further, FIG. 9, 10). In the case of InAlN/GaN heterostructure, d1 is approx. 2 nm and d2 is approx. 7 nm. Furthermore, by oxidizing at least a part of the second active layer, the gate insulating layer results directly from the second active layer and thus no interfacial layer is formed. In contrast to ex-situ deposition, eg. Atomic Layer Deposition for instance, no interface states are formed. The so-called "current collapse" which corresponds to the degradation of the device performances over the time generated in part by the interface states can be avoided which results in improved reliability.

Oxidizing the first region of the second active layer results in a high quality gate insulating layer. For example, a gate insulating layer formed by rapid thermal oxidation of an InAlN layer has the benefit to prevent diffusion of metals into the semiconductor substrate up to at least 1000° C., as is required for highly reliable FETs. This is further discussed with respect to FIGS. 12 and 13. The generated oxide film can be used as MIS transistor gate dielectric, etch stop layer, isolation between active regions or films and surface passivation layer.

When used in the formation of a MIS transistor gate insulating layer, the use of an oxygen ambient can drastically reduce the gate leakage current of the semiconductor device which is a major limitation for high device performances without increasing the gate to channel distance. The high bandgap of the resulting oxide associated to the high interface quality due to the in-situ growth of this layer enables a drastic enhancement of the gate breakdown voltage.

The gate insulating layer as described herein further prevents premature degradation of the semiconductor device at high temperature by preventing the diffusion of the gate material into the second active layer.

Rapid thermal processing in an oxygen ambient includes subjecting the substrate comprising the second active layer in a reaction chamber in an oxygen ambient at a predetermined temperature and time. The time is selected such that the required oxide thickness is obtained. Rapid thermal processing has as an advantage that the thickness of the gate insulating layer can be controlled with a high accuracy.

When used in the formation of a MIS transistor gate insulating layer, the use of an oxygen ambient can drastically reduce the gate leakage current of the semiconductor device which is a major limitation for high device performances without increasing the gate to channel distance. The high bandgap of the resulting oxide associated to the high interface quality due to the in-situ growth of this layer enables a drastic enhancement of the gate breakdown voltage.

The gate insulating layer as described herein further prevents premature degradation of the semiconductor device at high temperature by preventing the diffusion of the gate material into the second active layer.

The thickness of the gate insulating layer may be between 1 nm and 100 nm, between 1 nm and 50 nm, between 1 nm and 20 nm or between 5 nm and 15 nm.

The source electrode and drain electrode, also referred to as source contact and drain contact, are configured such that they form ohmic contacts with the 2 DEG through the second active layer. A source electrode and a drain electrode can, for example, be formed in a recess in the second active layer such that the distance between the ohmic contacts and the 2DEG is between the tunneling distance. This results in extremely ohmic contact resistances (the source and drain contacts) and enhance device frequency performances.

According to embodiments of the invention, the second active layer may comprise a recess. The recess does not protrude into the layer underneath the second active layer.

This means that the depth of the recess in the second active layer may be lower to the thickness of the second active layer and hence, there is still material of the second active layer present in the recess. The material of the second active layer in the recess can be subjected to rapid thermal oxidation, such that the material of the top part of second active layer is converted into a gate insulating layer. In that case, the gate insulating layer is formed in the recess in the second active layer.

According to embodiments of the invention, a nucleation layer can be grown on the substrate before the first and second active layers are provided. This nucleation layer acts as a transition layer between the substrate and the active layers. It allows the start of epitaxial growth on substrates that are chemically and structurally different from the epitaxial layers by first creating isolated islands of deposited material which later coalesce in a single layer. The nucleation layer may, according to particular embodiments, comprise or consist of GaN, AlGaN or AlN and may have a thickness of between 1 m and 100 nm.

The nucleation layer may have a lot of defects. Therefore, according to further embodiments of the present invention, the semiconductor device may furthermore comprise a buffer layer on the nucleation layer, i.e. between the nucleation layer and the first active layer. Such buffer layer may decrease the defect density in the active layers, which otherwise could result from growing the active layers directly onto the defect comprising nucleation layer. The buffer layer may comprise one or more layers comprising or consisting of GaN, AlGaN or AlN. The thickness of these layers may be between 20 nm and 500 nm and allows bending of propagating threading dislocations away from the vertical growth directions. The properties of the nucleation and buffer layer may directly influence the properties of the active layers, for example in terms of dislocation density and material resistivity.

The first active layer may be formed on the buffer layer or can be considered as being the top layer of the buffer layer.

According to embodiments of the invention, when the first and second active layers comprise several of the elements as listed and described above, they can be built from several layers of the respective elements, deposited one on top of the other. Several combinations of such elements and the layers are included within the scope of the present invention. Further, combinations of the respective layers are also included.

According to embodiments of the invention, the semiconductor device may furthermore comprise a spacer in between the first active layer and the second active layer. Such spacer layer repulses the electron wave function out of the second active layer, e.g. InAlN layer, into the first active layer, e.g. GaN layer, and away from the interface between the two layers. In this way, the electron wave function overlaps less with possible interface roughness or electrical roughness caused by compositional non-uniformity. Hence, scattering is reduced which in turn increases the electron mobility. According to embodiments of the invention, the spacer may have a high bandgap. An example of high bandgap as known by a person skilled in the art is typically higher than 2 eV. For AlN, the bandgap is 6.2 eV) and is very thin, for example around 1 nm or even less. The spacer may, for example, comprise AlN.

According to further embodiments of the invention, the semiconductor device may comprise a third active layer under the first active layer, i.e. in between the substrate and the first active layer, or according to other embodiments, in between the nucleation layer and the first active layer, or, according to still further embodiments, in between the buffer layer and the first active layer. The third active layer prefer-ably has a higher polarization than the first active layer so that the conduction band at the interface is bent because of the built in electrical field. The third active layer may have a higher bandgap than the first active layer. The higher bandgap of the third active layer with respect to the first active layer prevents electrons from entering this third active layer during pinch-off so that they cannot be caught in traps which would lead to dispersion effects. The two effects create a quantum well causing the confinement of the electrons in the 2DEG, but the polarization effect is the strongest effect in this case.

The third active layer may, for example, comprise a group III-nitride material. According to embodiments of the invention, the third active layer may comprise or consist of AlGaN, AlN, InAlGaN or InAlN. The thickness of the third active layer may, for example, be between 50 nm and 2 μm.

According to embodiments of the invention, the entire structure of the semiconductor device as described above may furthermore be capped with a passivation layer acting as an oxygen diffusion barrier to prevent long time corrosion. This passivation layer may seal the entire surface and needs therefore to be applied after gate fabrication. The passivation layer may, for example, be $Si_3N_4$, $SiO_2$ or other oxides with a high dielectric constant such as e.g. $Al_2O_3$, $HfO_2$ or $Sc_2O_3$. According to a particular embodiment, the passivation layer may, for example, be an amorphous $Si_3N_4$ layer.

In a second aspect, the present invention provides a method for forming a semiconductor device, e.g. an enhancement mode transistor. The method comprises:

providing a first active layer on a substrate,
providing a second active layer on the first active layer, the second active layer having a higher band gap compared to the first active layer, being substantially Ga-free,
oxidizing at least a part of the second active layer by thermal oxidation thereby forming a gate insulating layer, thereby consuming the top part of the second active layer and reducing the thickness of the second active layer so that the 2DEG is locally depleted,
providing a gate electrode on the gate insulating layer,
providing a source electrode and drain electrode on the second region of the second active layer.

wherein providing the first active layer and the second active layer is performed such that, when in operation and when the gate electrode and source electrode are at a same voltage, the semiconductor device furthermore comprises a two-dimensional electron gas (2-DEG) layer between the first active layer and the second active layer only outside the location of the gate electrode and not at the location of the gate electrode.

Hence, according to embodiments of the invention, providing the first active layer and the second active layer may be performed such that, when in operation and when the gate electrode and source electrode are at a same voltage, a 2-DEG layer is present between the first active layer and the second active layer only at locations of the device where no gate electrode is located and not underneath the gate electrode.

The second active layer can be Ga and/or In free. The second active layer can be a Group III nitride. Providing a second active layer may be performed by providing a layer comprising $In_xAl_{1-x}N$, x being between 0 and 0.5.

According to embodiments of the invention, providing the gate insulating layer may be performed by providing a layer comprising at least Al and oxygen. For example, the gate insulating layer may comprise Al, oxygen and In.

Providing the first active layer may be performed by providing a layer comprising a group III-nitride material, such as e.g. GaN.

According to embodiments of the invention, the method may furthermore comprise depositing a passivation layer on at least a part of the second active layer where no gate insulating layer present.

According to embodiments of the present invention, providing the first active layer and/or providing the second active layer may be performed by depositing the first active layer and/or depositing the second active layer by, for example, CVD, MOCVD or RF MBE.

The substrate, the first active layer, the second active layer, the gate insulating layer, and the passivation layer may be the same and may have the same characteristics as those described with respect to the first aspect of the invention. Also additional elements and layers described in the first aspect of the invention can apply tot the second aspect of the invention.

Hereinafter, some examples of semiconductor devices according to embodiments of the present invention will be described. It has to be understood that these examples are only for the sake of illustration and are not intended to limit the invention in any way.

FIG. 1 shows an illustrative example of a semiconductor device 10 according to one embodiment. According to the present example, the device is an enhancement mode (E-mode) transistor comprising:
- a substrate 1 with a buffer layer 2 on top of it, the buffer layer being, according to the present example, a GaN layer,
- a first active layer 3 formed by a top layer of the buffer layer 2,
- a second active layer 4 on the first active layer 3, the second active layer 4 being, according to the present example, a $In_xAl_{1-x}N$ layer, with x being 0.17,
- a gate insulating layer 5 on at least a part of the second active layer 4, the gate insulating layer 5 being formed by thermal oxidation of at least a part of the second active layer 4,
- a gate electrode 6, also referred to as gate contact, on the gate insulating layer 5, and
- a source electrode 7, also referred to as source contact, and a drain electrode 8, also referred to as drain contact, on the second active layer 4.

In operation and when the gate contact 6 and source contact 7 are at a same voltage, a two-dimensional electron gas (2-DEG) layer 9 is present between the first active layer 3, in the example given GaN layer, and the second active layer 4, in the example given InAlN layer, only outside the location of the gate contact 6, but no 2-DEG layer is formed between the active layers 3, 4, directly underneath the gate contact 6.

The source contact 7 and the drain contact 8 are, according to the example given, formed in a recess in the second active layer 4, in the example given InAlN layer, such that low contact resistances are obtained.

According to the example given, the semiconductor device 10 may furthermore comprise a passivation layer 11, e.g. SiN layer.

Figure 2:
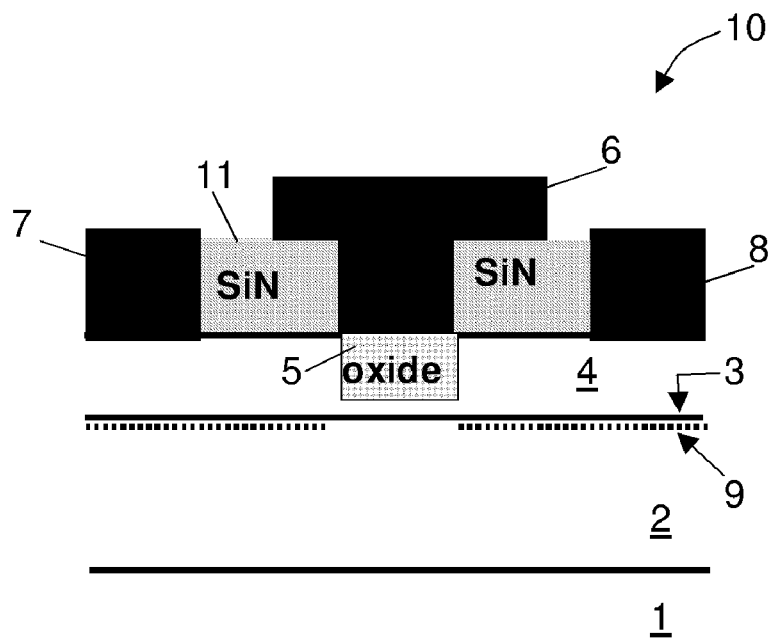

FIG. 2 shows another illustrative example of a semiconductor device 10 according to embodiments of the present invention. The semiconductor device 10 illustrated in FIG. 2 may comprise the same elements as the device 10 illustrated in FIG. 1. One difference between the semiconductor device 10 in FIG. 1 and the one in FIG. 2 is that in the semiconductor device 10 illustrated in FIG. 2 the source contact 7 and drain contact 8 are formed on top of the second active layer 4, in the example given InAlN layer, instead of in a recess in the second active layer 4 as was the case in FIG. 1.

Figure 3:
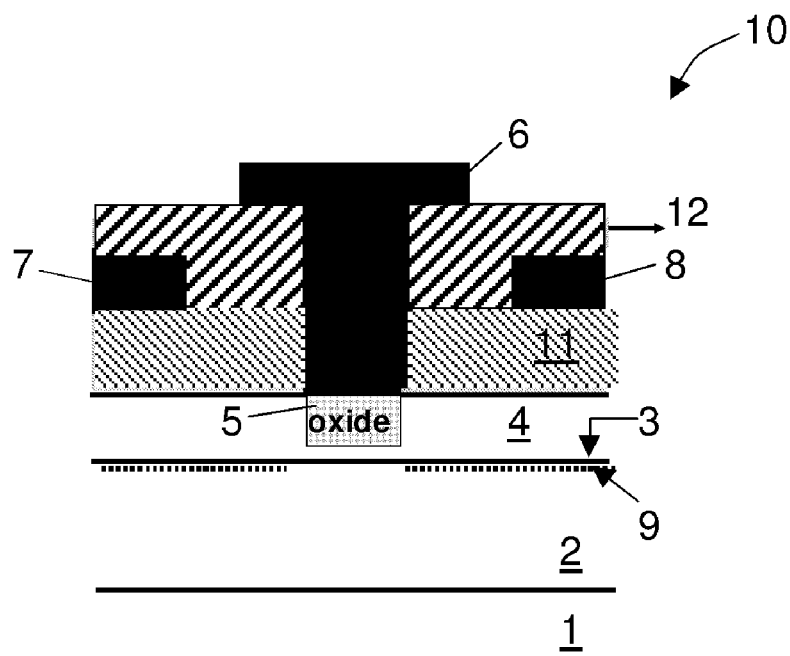

FIG. 3 shows a further illustrative example of a semiconductor device 10 according to embodiments of the present invention. The semiconductor device 10 illustrated in FIG. 3 again comprises the same elements as the semiconductor device 10 illustrated in FIG. 1. The difference between the semiconductor device 10 illustrated in FIG. 1 and the one in FIG. 3 is that the latter furthermore comprises an additional second passivation layer 12 above the first passivation layer 11, in the example given SiN layer. The second passivation layer may be used to further reduce the DC to RF dispersion as well to further protect the device from long term corrosion.

Figure 4:
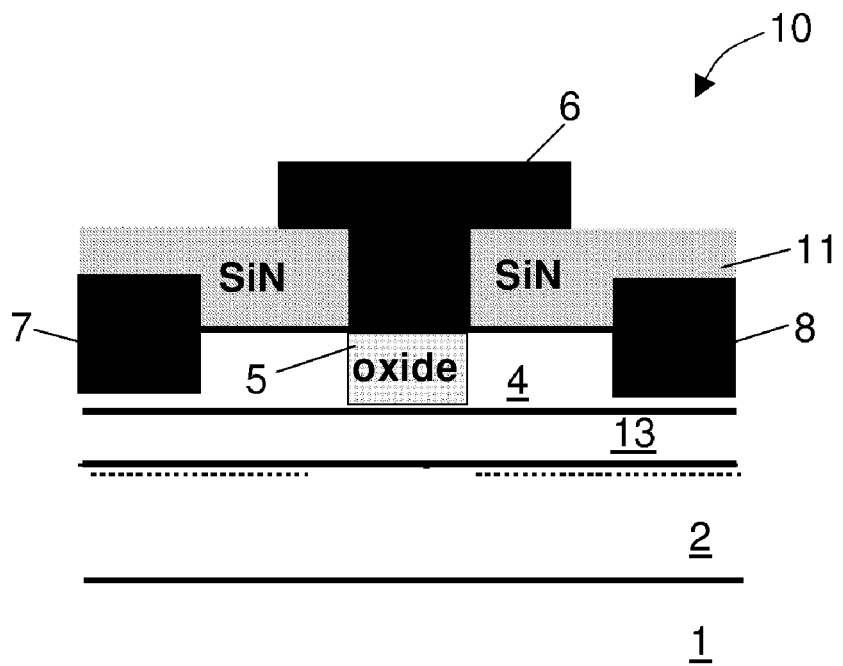

FIG. 4 shows another illustrative example of a semiconductor device 10 according to embodiment of the present invention. The semiconductor device 10 in FIG. 4 has the same elements as the semiconductor device 10 in FIG. 1. In FIG. 4, however, the semiconductor device 10 furthermore comprises a spacer layer 13, e.g. AlN spacer layer, between the first active layer 3, in the example given GaN layer, and the second active layer 4, in the example given InAlN layer.

Figure 5:
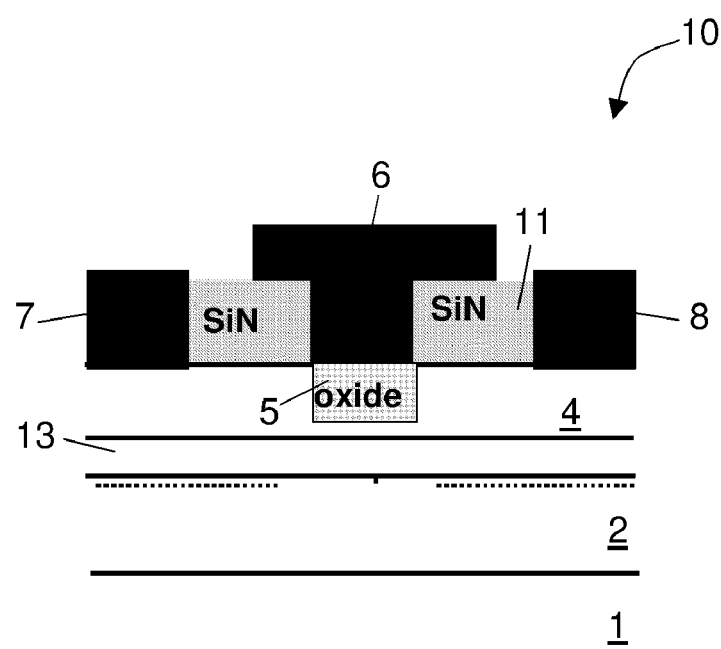

FIG. 5 shows another illustrative example of a semiconductor device 10 according to embodiments of the present invention. Similar to the example given in FIG. 4, the example given in FIG. 5 also comprises spacer layer 13, e.g. a AlN spacer layer, between the first active layer 3, in the example given GaN layer, and the second active layer 4, in the example given InAlN layer. The semiconductor device 10 illustrated in FIG. 5 has furthermore the same elements as the semiconductor device 10 in FIG. 2.

Figure 6:
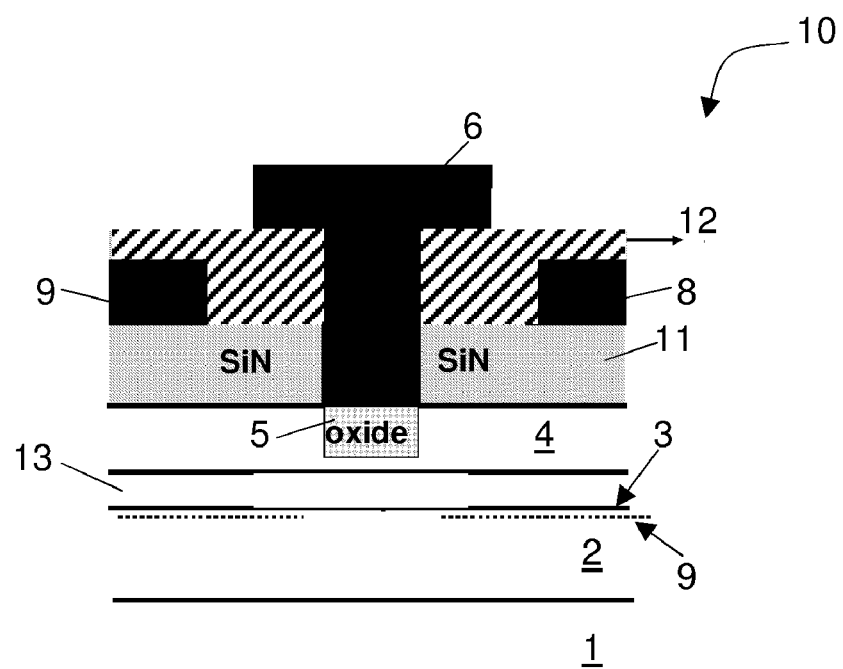

FIG. 6 shows another illustrative example of a semiconductor device 10 according to embodiments of the present invention. The semiconductor device 10 in FIG. 6 has the same elements as the semiconductor device 10 in FIG. 3. The semiconductor device illustrated in FIG. 6 furthermore comprises a spacer layer 13, e.g. AlN spacer layer, between the first active layer 3, in the example given GaN layer, and the second active layer 4, in the example given InAlN layer.

Figure 7A:
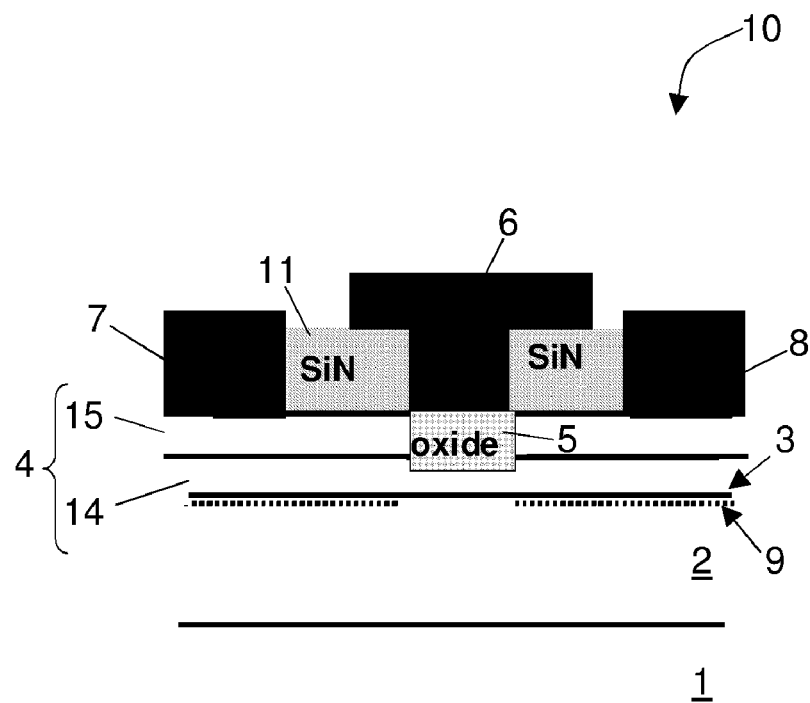

FIG. 7a shows a further illustrative example of a semiconductor device 10 according to embodiments of the present invention. In the present example, the second active layer 4 is formed by a stack of 2 layers, i.e. an undoped layer 14, in the example given an undoped InAlN layer, and a highly doped n-type layer 15, in the example given a highly doped n-type InAlN layer. The other parts of the semiconductor device 10 illustrated in FIG. 7a are similar to the parts of the semiconductor devices 10 illustrated in the previous figures.

Figure 7B:
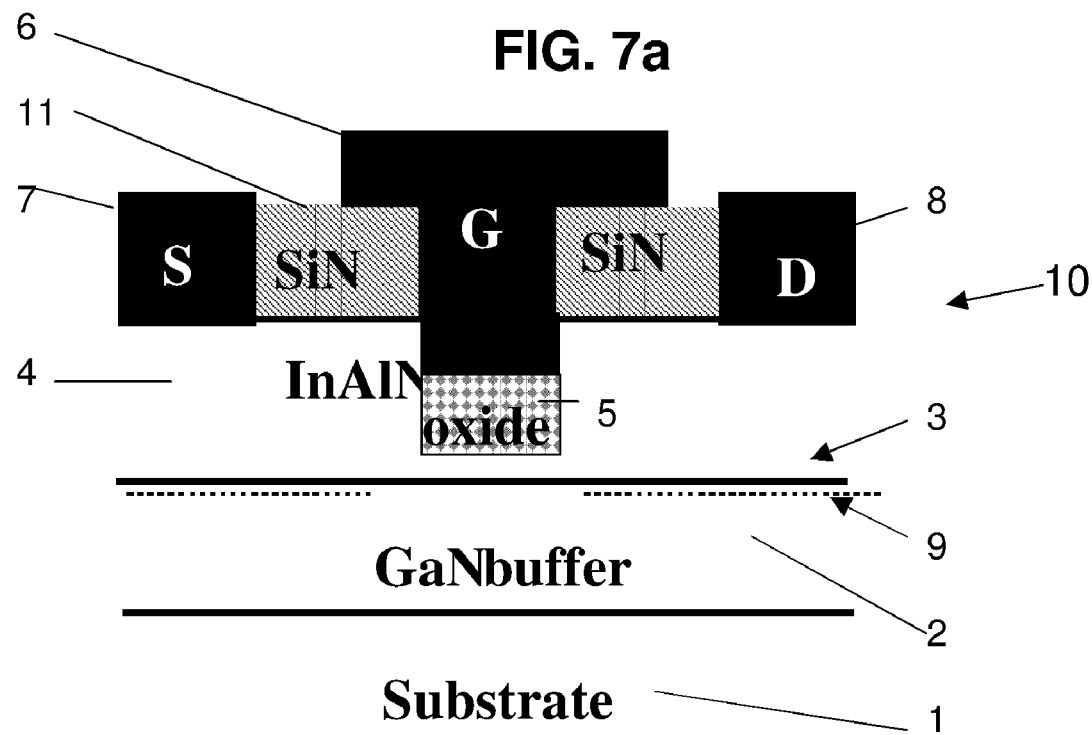

FIG. 7b shows a further illustrative example of a semiconductor device 10 according to embodiments of the present invention. In the present example, a recess if formed in the second active layer in the region where the gate insulating layer is formed. The second active layer underlying the recess is oxidized by thermal oxidation. Further, the gate electrode is formed on top of the gate insulating layer in the recess of the second active layer. The other parts of the semiconductor device 10 illustrated in FIG. 7 are similar to the parts of the semiconductor devices 10 illustrated in the previous figures.

Figure 8:
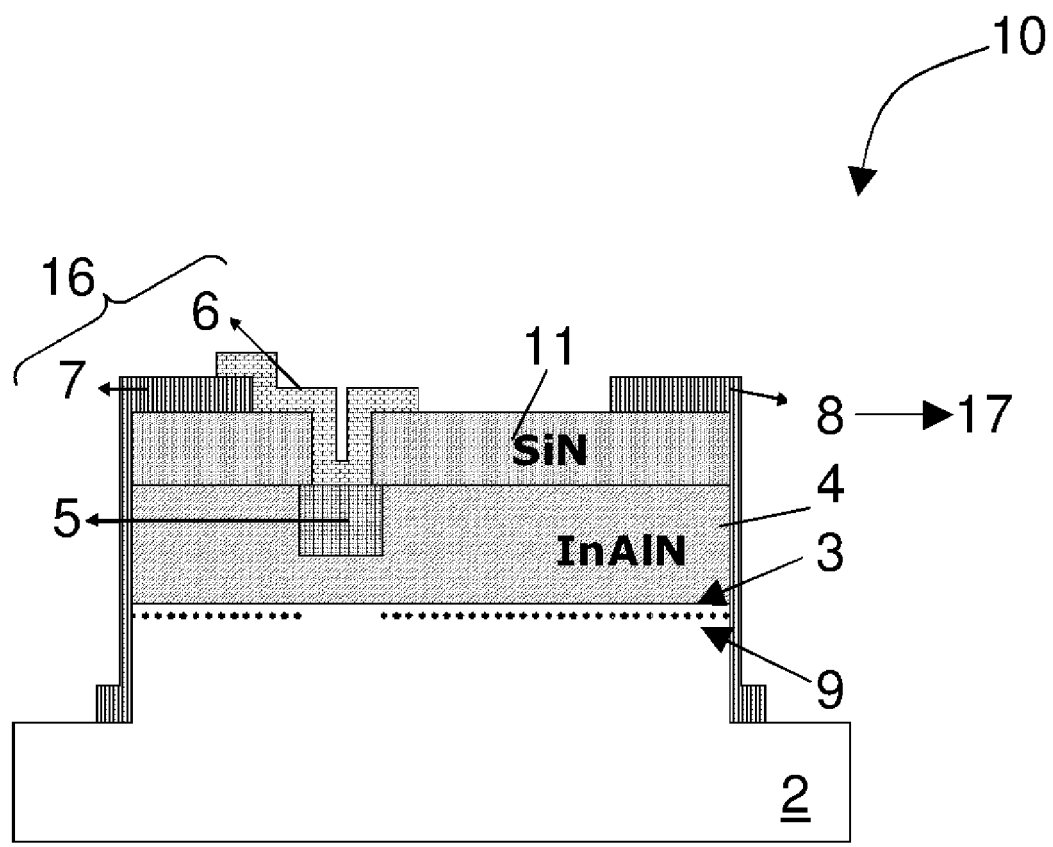

FIG. 8 represent another illustrative example of a semiconductor device 10 according to embodiments of the present invention. In the example given, the semiconductor device 10 is a diode wherein the threshold voltage $V_{th}$ is controllable by an oxidation process. The semiconductor device 10 is operated as a two-terminal device by short-circuiting one ohmic contact 7 or 8 and the gate contact 6. The short-circuited contact is in the example given is the source contact 7, but it has to be noted that according to other embodiments of the invention this may also be the drain contact 8. This combined contact is called the anode 16, whereas the other ohmic contact that is not short-circuited to the gate contact 6, in the example given the drain contact 8, is called the cathode 17. When the potential of the anode 16 is higher than the potential of the cathode 17 by at least the value of the threshold voltage $V_{th}$, current will flow between the anode 16 and the cathode 17. When the potential of the anode 16 is lower than the potential of the cathode 17 increased by $V_{th}$, then the channel below the gate contact 6 will be depleted and no current can flow. The operation of this semiconductor device 10 is that of a diode, with a $V_{th}$ that is controllable by oxidation process. The oxidation of the barrier layer implies a reduction of the barrier thickness under the gate which results in a shift of the threshold voltage ($V_{TH}$). In other words, the deeper the oxidation is, the lower the remaining barrier will be and consequently $V_{TH}$ can be controlled with the oxidation of the barrier layer.

Hereinafter, a method for forming a semiconductor device, e.g. an enhancement mode transistor, according to an embodiment of the invention will be described.

Figure 9:
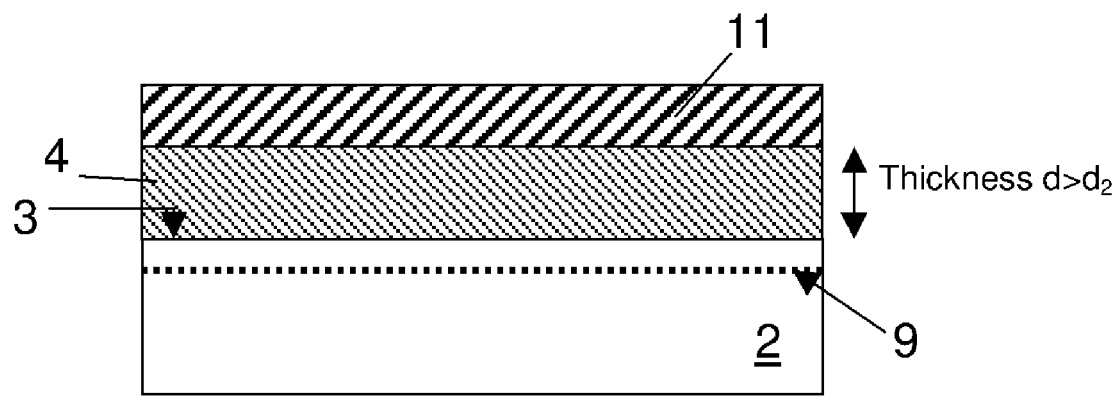
FIG. 9 shows a III-nitride heterostructure that can be used in a method according to embodiments of the present invention.
Figure 10:
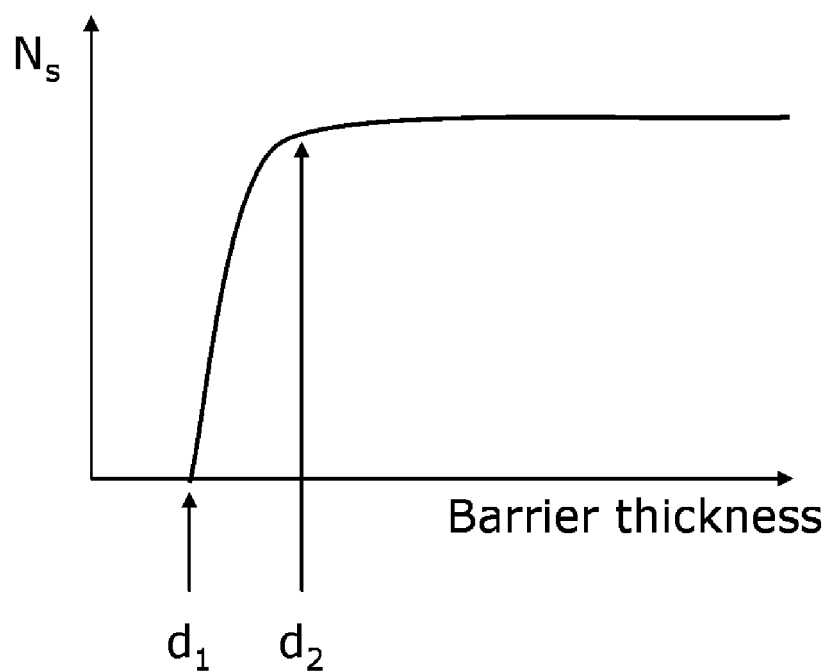
FIG. 10 shows a graph indicating the dependency of charge density in a 2DEG as a function of the thickness of the barrier layer.

In the example given, in a first step, a heterostructure comprising a buffer layer 2, e.g. (Al)GaN buffer layer of which a top layer forms the first active layer 3 and a Ga-free second active layer 4, e.g. AlN or InAlN, layer and also referred to as barrier layer is grown by, for example CVD, e.g. MOCVD or RF-MBE (see FIG. 9). The buffer layer 2 may be grown to a thickness d1 (see FIG. 10). The barrier layer or second active layer 4 is then grown onto the buffer layer 2 to a thickness at which the density of carriers in the channel is large enough to obtain a low sheet resistance (denoted $d_2$ in FIG. 10). The thickness of the second active layer may, for example, be between 1 nm and 100 nm, between 1 nm and 50 nm, between 1 nm and 20 nm or between 5 nm and 15 nm and may, for example, be 10 nm. Typically, a sheet resistance below 300 Ω/sq, below 200 Ω/sq is achieved. According to embodiments of the invention, the barrier layer 4 may be capped with an in-situ grown passivation layer 11, e.g. $Si_3N_4$ layer, to prevent relaxation of the barrier layer 4 and to passivate surface states.

Figure 11:
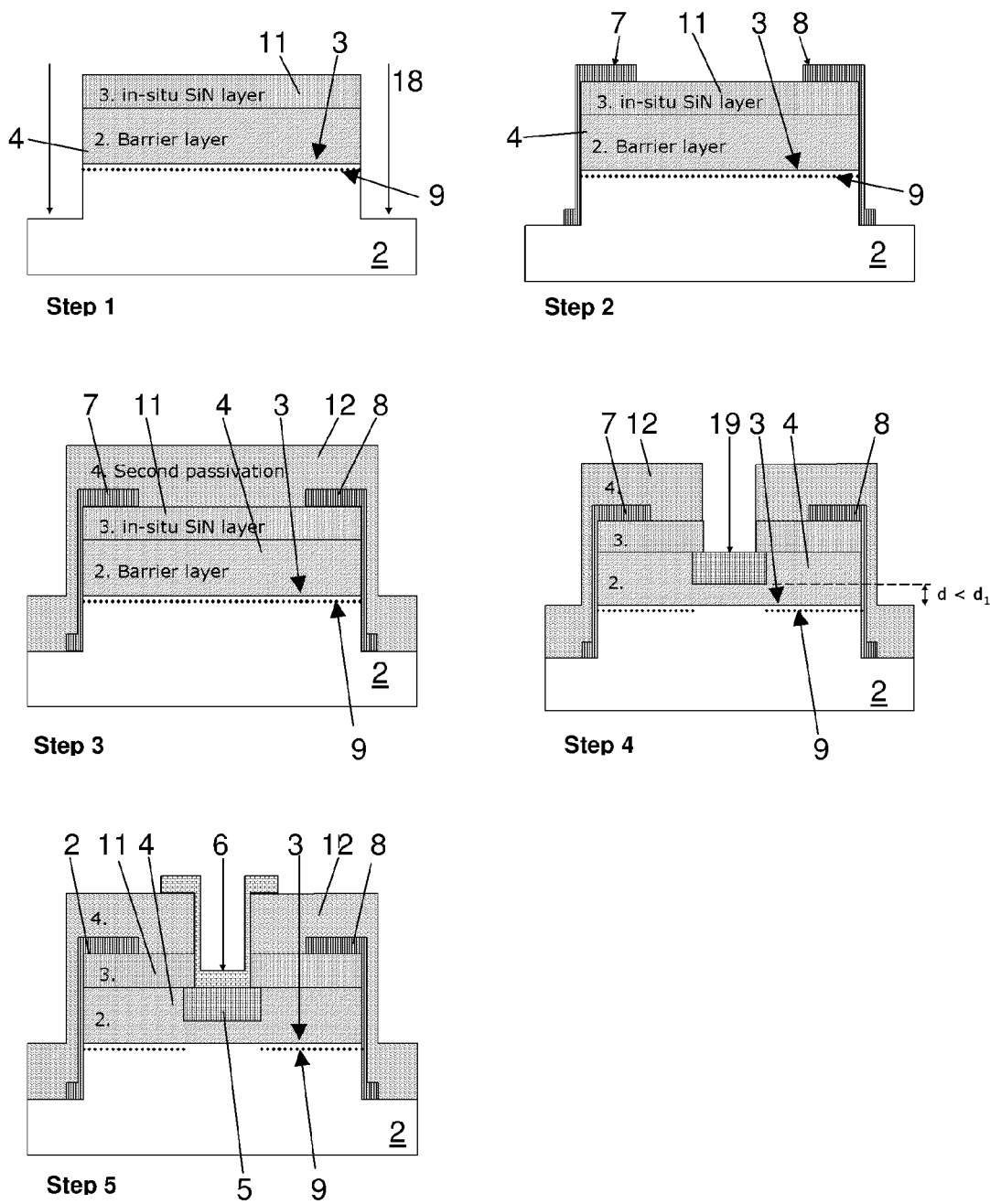
FIG. 11 illustrates subsequent steps in a method according to an embodiment of the present invention.

Further manufacturing of the semiconductor device 10 according to embodiments of the invention may the be performed using a combination of different processes. An exemplary process which is illustrated in FIG. 11 may, for example, comprise:

a device isolation step by mesa etching, impurity implantation or even complete thermal oxidation of the barrier layer 4 (see FIG. 11, step 1). This meta etching is carried out by formation of trenches 18.

an ohmic contact formation step, in which source and drain contacts 7, 8 are formed by depositing a TiAlMoAu stack on top of the passivation layer 11, e.g. Si3N4 layer, or on top of the barrier layer 4 after local removal of the passivation layer 11, e.g. Si3N4 layer. These contacts 7, 8 are subsequently annealed to obtain ohmic behavior (see FIG. 11, step 2). In this embodiment, the source and drain contacts 7, 8 extend into the trenches 18 up to the bottom of these trenches 18. The source and drain contacts 7,8, are therewith in contact with the buffer layer 2 directly deposition of an interconnect metallization scheme;

deposition of SiO2 as a second passivation layer 12 on top of the passivation layer 11, e.g. Si3N4 layer (FIG. 11, step 3).

In the second passivation layer 12, trenches 19 are etched that define the gate footprint and that locally uncover the barrier layer 4 at the site of the gate footprint (i.e. removing the SiO2 second passivation layer 12 as well as the in-situ first passivation layer, e.g. Si3N4 layer). The sample is then subjected to an oxidation step, e.g. by placing the sample in an oven at 800° C. in an oxygen ambient for a few minutes, so that the second active layer or barrier layer 4, e.g. AlN or InAlN layer, is partially oxidized (e.g. at a rate of about 0.5 nm/min) to the degree that the remaining unoxidised thickness of the barrier layer 4, or in other words the remaining part of the barrier layer 4, is thinner than the thickness d1, i.e. thinner than the thickness of the buffer layer 2. d2 is barrier layer thickness for which the carrier density starts to decrease and d1 is the critical thickness of the barrier layer for which the 2DEG is formed (see FIG. 9, 10 and FIG. 11, step 4). At this thickness, the 2DEG is locally depleted, so that in the final device 10 with a zero volt gate bias, no current can flow in the channel between the source and drain contact 7, 8.

Consequently a Schottky metal is deposited and T-shaped gate contacts 6 are formed across the trenches 18 defined in the step before, either by lift-off or preferably by a metal etch process (see FIG. 11, step 5).

Figure 15:
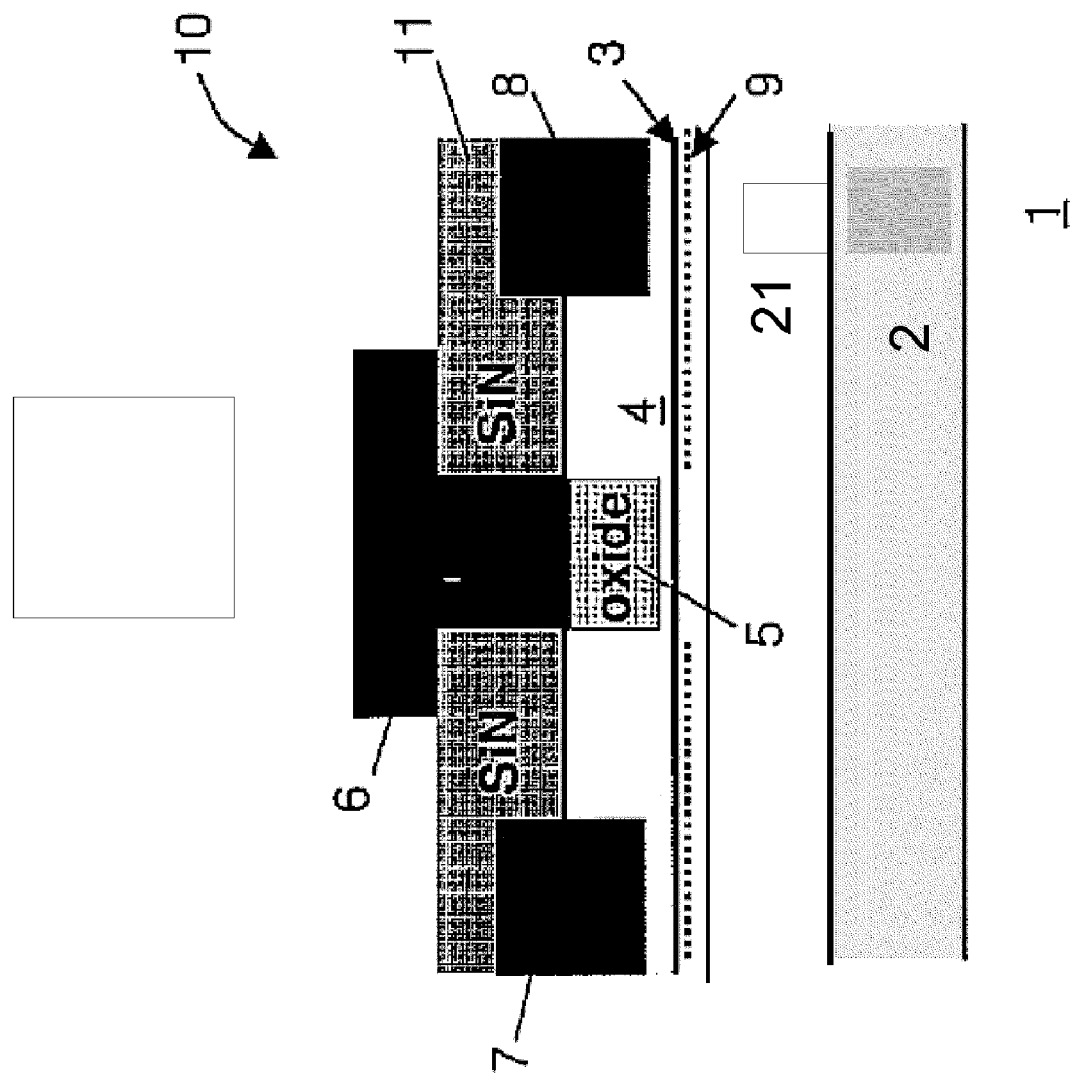
FIG. 15 is an illustrative example of a semiconductor device according to an embodiment of the present invention.

FIG. 15 shows an illustrative example of a semiconductor device according to a further embodiment of the present invention. A third active layer 21 is present between the first active layer 3 and the substrate. This layer is preferably an AlGaN buffer layer. In this configuration, the thickness of the first active layer is between 10 nm and 500 nm, preferably 100 to 200 nm, for instance 150 nm. The thickness of the third active layer 21 is higher than 500 nm, preferably higher than 1000 nm or even higher. In this particular example, the thickness of the third active layer is 2 μm. Its Al content is between 5% and 100%, preferably between 8% and 18%. The third active layer is selected such that the polarization of the third active layer is higher than the bandgap of the first active layer. Preferably, the bandgap of the third active layer is higher than the bandgap of the first active layer as well.

Figure 12A:
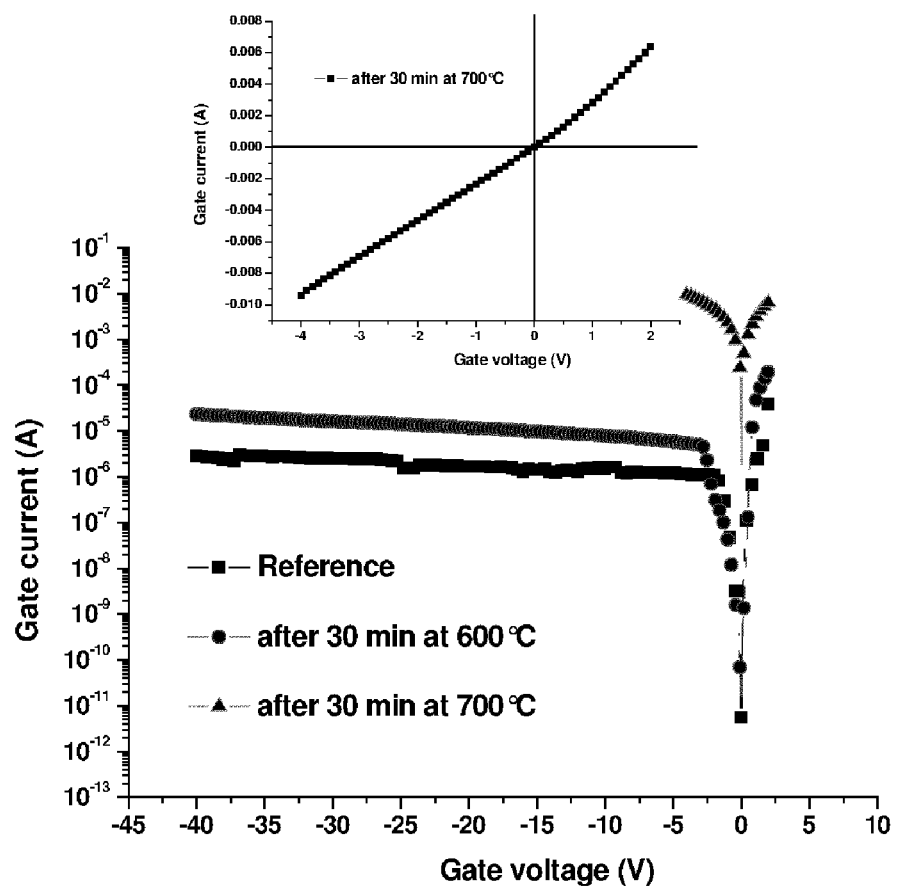
FIG. 12 shows the Schottky contact characteristics as a function of the annealing temperature of a SiN/AlGaN/GaN heterostructure and $Al_2O_3$/InAlN/GaN heterostructures according to embodiments of the present invention.
Figure 12A:
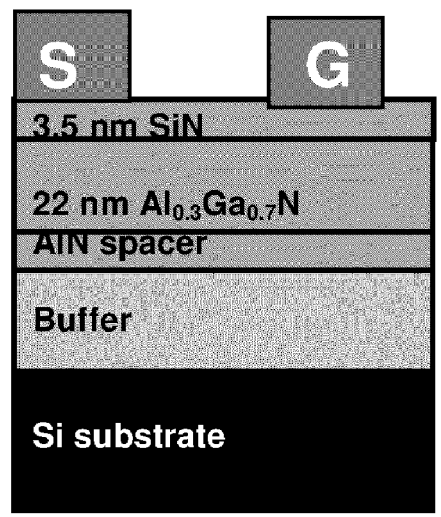
Figure 12B:
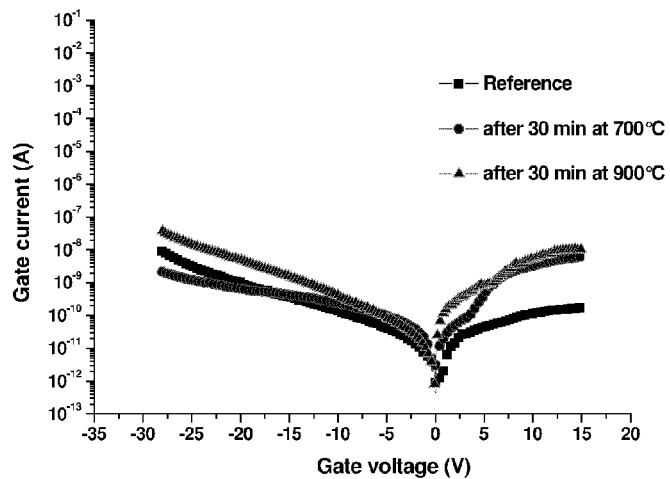
Figure 12B:
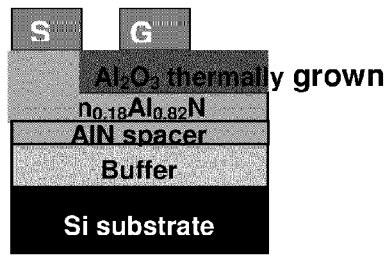
Figure 13:
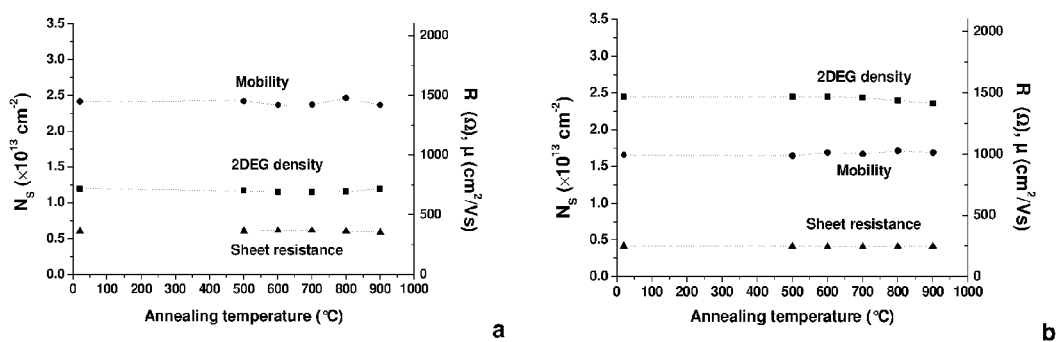
FIG. 13 illustrates 2DEG densities (Ns: square), mobility (μ: circle) and sheet resistances (R: triangle) as a function of annealing time in (a) SiN/Al0.3Ga0.7N/GaN, (b) unstrained In0.18Al0.82N/GaN.

FIGS. 12 and 13 relate to the thermal stability enhancement of the gate characteristics using the InAlN oxide. The devices in this example were grown by MOCVD on (111) Si substrates. They consist of a GaN buffer layer and an AlN layer on top of the GaN buffer layer.

In experiment a) an undoped barrier layers which is composed of 22 nm Al0.3Ga0.7N is deposited on top of AlN layer, followed by the deposition of 3.5 nm in-situ SiN cap layer. Prior to the gate deposition the in-situ SiN on the top of AlGaN and AlN barrier layers were removed by dry etching using SF6. Conventional processing was performed up to the ohmic contacts.

This device is also called "SiN/AlGaN/GaN heterostructure."

In experiment b) a layer of 30 nm lattice matched In0.18Al0.82N is deposited on top of the AlN layer. The InAlN surface was thermally oxidized at 800° C. in O2 (similar to Silicon technology) using oxidation time of 0, 5 and 10 min. XPS analysis revealed a significant peak corresponding to Al2O3. Finally, Ni/Au circular Schottky contacts with a diameter of 100 μm were deposited. This device is also called "Al2O3/InAlN/GaN heterostructure."

In vacuum the samples have been heated in intervals of 100° C. and kept at the temperature for 30 min. At each temperature step the sample was cooled down to the room temperature and data were taken to evaluate permanent degradation. The sheet resistance, the mobility and the density of the 2DEG were characterized using the Van der Pauw Hall measurement. I-V measurements were performed to characterize the Schottky contacts.

FIG. 13 represents the 2DEG densities (Ns: square), mobility (μ: circle) and sheet resistances (R□: triangle) as a function of annealing temperature in (a) SiN/Al0.3Ga0.7N/GaN, (b) In0.18Al0.82N/GaN.

The "SiN/AlGaN/GaN heterostructure" is found to be fully stable up to 900° C. (FIG. 13a). In the case of unstrained In0.18Al0.82N/GaN, no degradation of the 2DEG behavior is noticed.

FIG. 12 shows the Schottky contact characteristics as a function of the annealing temperature of the SiN/AlGaN/

GaN heterostructure and the $Al_2O_3$/InAlN/GaN heterostructures. 10 diodes have been characterized for each sample. Even though the material properties of SiN/AlGaN/GaN system are stable at 700° C., an increase of the leakage current is observed giving rise to an almost ohmic contact (see inset of FIG. 12.a). This is attributed to the diffusion of the gate metal into the barrier layer. Similar degradation at 700° C. has been obtained with SiN/AlN/GaN devices. However, it is observed that the use of the InAlN native oxide (Al2O3) enables not only an exponential reduction of the gate leakage current and thus a significant increase of the gate breakdown voltage as a function of the oxidation time but also an enhanced device thermal stability up to at least 900° C. (see FIG. 12.b). It has to be pointed out that for 10 min thermal oxidation the turn-on voltage is shifted from 1.5 V to more than 15 V as compared to the reference sample while marginal gate leakage degradation occurred after 30 min at 900° C., illustrating the highly insulating oxide film property.

Figure 14:
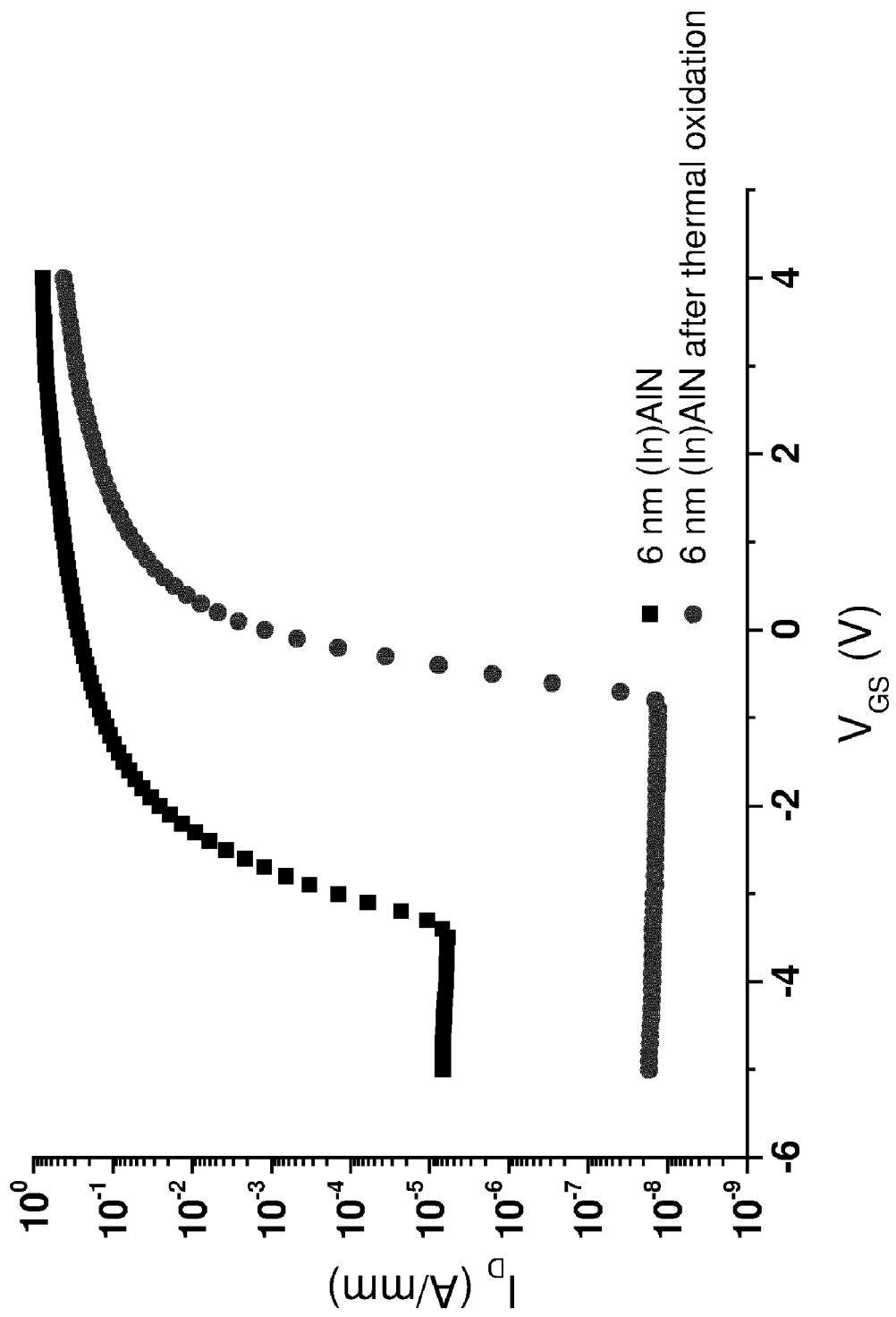
FIG. 14 is a graph showing that the use of a thermal oxide as a gate insulating layer significantly improves the properties of the device, the oxidation step causing a significant shift of the threshold voltage up to 0 V. while additionally lowering the drain current.

FIG. 14 shows the drain current Id as a function of the gate voltage Vgs for a prior art device and a device according to one embodiment. The upper line corresponds to the prior art device and the lower line corresponds to the device according to one embodiment. This figure shows results from experiments carried out with a device structure as shown in FIG. 4, having a AlGaN buffer layer 2, including the first active layer, on the substrate 1. Thereon, a spacer layer 13 (also channel) is present. On top hereof, the second active layer 4 is present, comprising a 1 nm undoped layer 14 and a 6 nm highly doped layer 15. The structure is covered with source and drain contacts 7, 8, a metal gate contact and a passivation layer. In the device, the gate insulating layer is generated by local thermal oxidation of the highly doped layer 15. In the prior art device, there was no thermal oxidation and the gate is in contact with the highly doped layer 15.

As shown in the FIG. 14, the use of a thermal oxide as a gate insulating layer significantly improves the properties of the device. The oxidation step causes a significant shift of the threshold voltage up to 0 V. Additionally it lowers the drain current (i.e. it reduces the leakage current) of the device. It is clear from these results that the conversion of the InAlN into Al-oxide can locally deplete the 2DEG. The same results were also obtained using a 8 nm thick InAlN barrier layer.

Further Embodiments

Another embodiment is described as follows. First, the silicon substrate is annealed in hydrogen at 1120° C. for 15 min before growth. Then, an AlN layer is grown as the nucleation layer. Afterwards, a stack of $Al_xGa_{1-x}N$ (70%<x<80%) intermediate layers is deposited to provide compressive stress in the subsequent AlxGa1–xN layer in order to prevent cracking. The stack of $Al_xGa_{1-x}N$ layers is such that x increases towards the top of the structure. Next, on top of this $Al_xGa_{1-x}N$ stack of layers, a GaN channel layer with a thickness varying from 20 to 500 nm is deposited, followed by an InAlN layer in which the In composition is tuned by changing the growth temperature. The growth temperature is in the range of 800° C. to 1050° C. The thickness of the InAlN layer can be in the range of 1 to 100 nm. Both lattice matched as well as non-lattice matched structures have been grown. Next, the InAlN layer is capped with an $Si_3N_4$ layer deposited in the same deposition chamber.

The AlN layer, the $Al_xGa_{1-x}N$ stack, the GaN layer, the InAlN layer and the $Si_3N_4$ layer are deposited by MOVPE on Si(111) substrates using a Thomas Swan CCS (close coupled showerhead) reactor. Trimethylgallium (TMGa), trimethylaluminum (TMAl), trimethylindium (TMI) and ammonia (NH3) were used as precursors for Ga, Al, In and N respectively. H2 is used as carrier gas.

Conclusion

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

It is to be understood that although preferred embodiments, specific constructions and configurations, as well as materials, have been discussed herein for devices according to the present invention, various changes or modifications in form and detail may be made without departing from the scope of this invention as defined by the appended claims.

What is claimed is:

1. A semiconductor device comprising:
    a first active layer on a substrate;
    a second active layer on the first active layer, the second active layer having a higher bandgap than the first active layer, being substantially free of Ga and comprising at least Al;
    a two-dimensional electron gas (2-DEG) layer being present, in operation, on at least part of an interface between the first active layer and the second active layer;
    a gate insulating layer on at least a part of the second active layer;
    a gate electrode on at least a part of the gate insulating layer; and
    a source electrode and drain electrode on the second active layer,
    wherein the gate insulating layer is a thermal oxide formed by thermal oxidation of at least a part of the second active layer at a temperature between 500° C. and 1000° C., thereby consuming the top part of the second active layer and reducing the thickness of the second active layer so that the 2DEG is locally depleted.

2. The semiconductor device according to claim 1, wherein the second active layer comprises $In_xAl_{1-x}N$, x being between 0 and 0.5.

3. The semiconductor device according to claim 2, wherein the second active layer has a graded indium (In) composition or a graded aluminum (Al) composition or wherein the second active layer is substantially Indium-free.

4. The semiconductor device according to claim 1, wherein the gate insulating layer comprises at least Al and oxygen.

5. The semiconductor device according to claim 1, wherein the first active layer comprises a group III-nitride material, or wherein the first active layer comprises GaN.

6. The semiconductor device according to claim 1, wherein the second active layer further comprises a recess and wherein the gate insulating layer is present in the recess in the second active layer.

7. The semiconductor device according to claim 1, wherein the semiconductor device further comprises a passivation layer on at least a part of the second active layer where no gate insulating layer is present.

8. The semiconductor device according to claim 1, wherein the semiconductor device is an enhancement mode transistor.

9. The semiconductor device according to claim 1, wherein a third active layer is grown between the substrate and first active layer, the third active layer having a bandgap higher than the bandgap of the first active layer and the third active layer having a pyro-electric polarization higher than the pyro-electric polarization of the first active layer.

10. The semiconductor device according to claim 1, wherein the 2DEG is depleted underneath the gate electrode.

11. The semiconductor device according to claim 1, wherein, when in operation and when the gate electrode and the source electrode are at the same voltage, the 2DEG is present between the first active layer and the second active layer at locations where no gate electrode is located and not underneath the gate electrode.

12. The semiconductor device according to claim 1, wherein the thickness of the second active layer is reduced by the thermal oxidation to a selected thickness at which the 2DEG is locally depleted.

13. The semiconductor device according to claim 1, wherein the thermal oxidation is performed at a temperature between 700° C. and 900° C.

* * * * *

UNITED STATES PATENT AND TRADEMARK OFFICE
CERTIFICATE OF CORRECTION

PATENT NO. : 8,309,987 B2
APPLICATION NO. : 12/502960
DATED : November 13, 2012
INVENTOR(S) : Joff Derluyn et al.

It is certified that error appears in the above-identified patent and that said Letters Patent is hereby corrected as shown below:

Title page 1, Item 75, line 2, please change "Quévrechain" for Farid Medjdoub to --Quiévrechain--.

Title page 1, Col. 2, line 7, under Item 56, "Other Publications," please change "InA1As" to --InAlAs--.

Title page 1, Col. 2, line 8, under Item 56, "Other Publications," please change "InA1As" to --InAlAs--.

Title page 1, Col. 2, line 14, under Item 56, "Other Publications," please change "A1$_{0.48}$" to --Al$_{0.48}$--.

Title page 1, Col. 2, line 14, under Item 56, "Other Publications," please change "High-K" to --High-κ--.

In the Drawings

On sheet 6 of 11, Figure 9, line 1, please change "d" to --d$_1$--.

On sheet 7 of 11, Figure 11, line 1, please change "d" to --d$_1$--.

On Sheet 9 of 11, Figure 12b, line 8, please change "n$_{0.18}$Al$_{0.82}$N" to --In$_{0.18}$Al$_{0.82}$N--.

In the Specifications

In Col. 8, line 17, please change "layer." to --layer,--.

In Col. 9, line 19, please change "InAlN" to --InAlN--.

In Col. 9, line 19, please change "InAlN with" to --InAlN with--.

In Col. 11, line 20, please change "m" to --nm--.

In Col. 12, line 41, please change "layer." to --layer,--.

In Col. 13, line 15, please change "tot" to --to--.

In Col. 13, line 32, please change "In$_x$Al$_{1-x}$lN" to --In$_x$Al$_{1-x}$N--.

In Col. 13, line 64, please change "InAlN" to --InAlN--.

Signed and Sealed this
Sixteenth Day of July, 2013

Teresa Stanek Rea
*Acting Director of the United States Patent and Trademark Office*

CERTIFICATE OF CORRECTION (continued)
U.S. Pat. No. 8,309,987 B2

In Col. 15, line 36, after "may" please delete "the".

In Col. 15, line 43, please change "18." to --18;--.

In Col. 15, line 53, please change "directly" to --directly;--.

In Col. 16, line 49, please change "InAIN" to --InAlN--.

In Col. 16, line 59, please change "(R☐:" to --(R:--.

In Col. 17, line 1, please change "InAIN" to --InAlN--.

In Col. 17, line 6, please change "12.a)." to --12a).--.

In Col. 17, line 13, please change "12.b)." to --12b).--.

In Col. 17, line 53, please change "InAIN" to --InAlN--.